United States Patent
Nakagawa

(10) Patent No.: US 10,795,202 B2
(45) Date of Patent: Oct. 6, 2020

(54) DISPLAY DEVICES

(71) Applicant: Panasonic Liquid Crystal Display Co., Ltd., Himeji-shi, Hyogo (JP)

(72) Inventor: Teruhisa Nakagawa, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 16/206,440

(22) Filed: Nov. 30, 2018

(65) Prior Publication Data

US 2020/0174315 A1 Jun. 4, 2020

(51) Int. Cl.
*G02F 1/1335* (2006.01)
*G02F 1/1343* (2006.01)
*G09G 3/36* (2006.01)
*H01L 29/786* (2006.01)
*G02F 1/1333* (2006.01)

(52) U.S. Cl.
CPC .. *G02F 1/133536* (2013.01); *G02F 1/133308* (2013.01); *G02F 1/134309* (2013.01); *G09G 3/3614* (2013.01); *G09G 3/3648* (2013.01); *H01L 29/78606* (2013.01)

(58) Field of Classification Search
CPC ............. G02F 1/136286; G02F 1/1368; G02F 2001/136295
See application file for complete search history.

(56) References Cited

U.S. PATENT DOCUMENTS

| | | | | |
|---|---|---|---|---|
| 2009/0091671 A1* | 4/2009 | Tsubata | ................. | G02F 1/1345 349/38 |
| 2014/0152938 A1* | 6/2014 | Lee | ...................... | G09G 3/3648 349/46 |
| 2016/0093261 A1* | 3/2016 | Kawamura | .......... | G09G 3/3648 345/204 |
| 2017/0123253 A1* | 5/2017 | Sugita | .................. | G02F 1/1368 |

\* cited by examiner

*Primary Examiner* — Michael H Caley
*Assistant Examiner* — Mariam Qureshi
(74) *Attorney, Agent, or Firm* — Hamre, Schumann, Mueller & Larson, P.C.

(57) ABSTRACT

Techniques of effective and continuous signal transmission in a display device are described. Techniques of the present subject matter allow lead-out lines of the display device to provide continuous transmittance of signals to data/gate lines. In an example, the display device may include a plurality of pixels arranged in a first direction and a second direction in a matrix arrangement, and a plurality of first lines extending in the first direction and a plurality of second lines extending in the second direction. Further, the display device may also include a plurality of lead-out lines extending in the first direction, such that, a lead-out line from the plurality of lead-out line overlaps a second line from the plurality of second lines to form an overlap region, where, the lead-out lines may be electrically connected to the second lines through a plurality of contact points in the overlap region.

10 Claims, 10 Drawing Sheets

DISPLAY DEVICES

TECHNICAL FIELD

The present subject matter relates, in general, to liquid display devices, and in particular, to signal transmission in liquid crystal display (LCD) devices.

BACKGROUND

Liquid crystal display (LCD) devices have become ubiquitous in today's daily life of humans. LCD panels are used in various electronic devices, such as televisions, laptops, tablets, and other communication devices, such as smartphones, notebooks, and personal digital assistants (PDAs). An electronic device generally comprises a bezel that surrounds an LCD panel securely within the electronic device. The bezel houses various other components apart from the LCD panel, such as driving circuits, image controllers, and image processors for driving the LCD panel.

SUMMARY

Techniques of effective and continuous signal transmission in a display device are described. Techniques of the present subject matter allow lead-out lines of the display device to provide continuous transmittance of signals to data/gate lines.

In an example, a display device includes a plurality of pixels arranged in a first direction and a second direction in a matrix arrangement. The display device may also include a plurality of first lines extending in first direction, and a plurality of second lines extending in second direction. The display device may further include a plurality of lead-out lines extending in first direction, where a lead-out line from the plurality of lead-out lines, may overlap with at least one second line from a plurality of second lines, to form an overlap region. A plurality of overlap regions may be formed in a similar way by overlap of the plurality of lead-out lines with the plurality of second lines. In an example, the plurality of lead-out lines may be electrically connected to plurality of second lines through two or more contact points formed in the overlap region.

In an example implementation of present subject matter, a first line from the plurality of first lines may be a data line, and a second line from the plurality of second lines may be a gate line. In the example, the lead-out line and the data line may be formed in the same layer.

In another example implementation of the present subject matter, a lead-out line out from the plurality of lead-out lines may be a gate lead-out line, and a second line out from a plurality of second lines may be a gate line. In such an example, a gate driver may be placed at a first side of the display device to drive the gate lead-out lines. The gate driver may further drive gate lines via an electrical connection between the gate lines and gate lead-out lines, made in the overlap region.

In yet another example implementation of present subject matter, a lead-out line out of the plurality of lead-out lines may be a data lead-out line and a second line out of a plurality of second lines may be a data line. In the example, a data driver may be placed at a first side of the display device to drive the data lead-out lines. The data driver may further drive data lines via an electrical connection between the data lines and data lead-out lines.

In an example implementation of present subject matter, a lead-out line may be electrically connected to a second line via a plurality of contact points formed in the overlap region. In an example, the plurality of contact points may be aligned in the first direction.

In another example implementation of present subject matter, the second line may have an extended portion formed in the overlap region. In an example, the extended portion may be wider than a middle portion of the second line formed between two adjacent overlap regions. In the example, the extended portion may have a greater width than the middle portion of the second line in the first direction. The second line may further have a cross shape formed in the overlap region. In an example, the second line may be a gate line, and the extended portion may extend towards opposite sides of the display device in the first direction.

In another example implementation of present subject matter, a lead-out line may be electrically connected to a second line via a plurality of contact points formed in the overlap region. In an example, the plurality of contact points may be aligned in the second direction.

In an example implementation of present subject matter, the lead-out line may have an extended portion formed in the overlap region. The extended portion may be wider than a middle portion of the lead-out line formed between two adjacent overlap regions. In an example, the lead-out line may be a gate lead-out line, and the extended portion of the gate lead-out line may extend towards an opposite side of a data line, nearest to the gate lead-out line.

In an example implementation of present subject matter, a conductive patch may be formed on a lead-out line. The conductive patch may be formed between two adjacent overlap regions from a plurality of overlap regions. The lead-out line may be electrically connected to the conductive patch via a plurality of through holes formed in an insulating layer between the conductive patch and the lead-out line. In an example, each of the through holes out of a plurality of through holes may be located at a distal end of the conducive patch, such that, the through hole may overlap a distal end of the conductive patch, in plan view. In another example, the conductive patch may extend in the first direction.

BRIEF DESCRIPTION OF DRAWINGS

The following detailed description references the drawings wherein.

DETAILED DESCRIPTION

Figure 1:
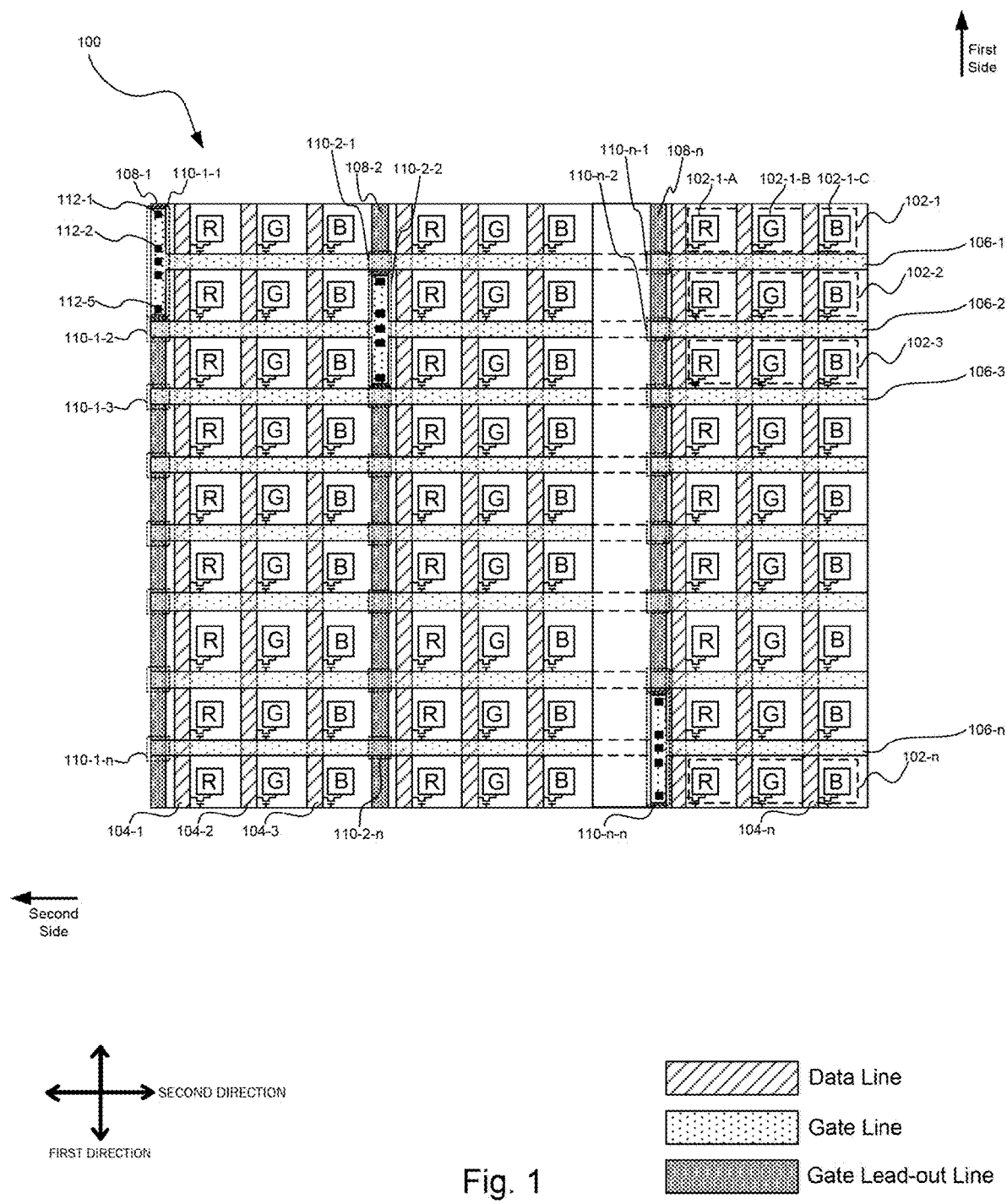
FIG. 1 illustrates a schematic configuration in a display area of a display panel including gate lead-out lines, according to a first implementation of present subject matter.

A liquid crystal display (LCD) device generally includes one or more LCD panels along with multiple driving elements, such as circuit drivers, timing controllers and one or more image processor(s) for processing video signals and driving the LCD panels. An LCD panel generally includes multiple sub-pixels arranged in a plurality of rows and columns to form a matrix. The LCD panel is integrated with driving circuits, such as a data driver and a gate driver. A data driver may provide data signals to the sub-pixels of the LCD panel via multiple data lines arranged parallel to each other and a gate driver may provide gate signals to the sub-pixels of the LCD panel via multiple gate lines arranged parallel to each other.

The data lines and the gate lines are generally arranged in orthogonal directions in the LCD panel. For example, if the data lines are arranged along the column direction of the matrix of sub-pixels, the gate lines are arranged along the row direction of the matrix of sub-pixels, and vice-versa. Thus, each sub-pixel of the LCD panel is surrounded by two adjacent gate lines and two adjacent data lines.

In some display devices, the LCD panel also includes multiple lead-out lines which are arranged either in the column direction or in the row direction. That is, if the LCD panel includes gate lines extending in the row direction and the data lines extending in the column direction, lead-out lines may be included in the LCD panel, which extend either in the column direction or in the row direction. In a situation where the lead-out lines extend in the column direction, the lead-out lines are electrically connected to a gate driver and the data lines are electrically connected to a data driver. Further, each lead-out line extending in the column direction is electrically connected to at least one gate line extending in the row direction, through a contact point.

Similarly, in another situation where the lead-out lines extend in the row direction, the lead-out lines are electrically connected to a data driver and the gate lines are electrically connected to a gate driver. Further, each lead-out line extending in the row direction is electrically connected to at least one data line extending in the column direction, through a contact point.

In such arrangements of lead-out lines, since there exists a single electrical connection between each lead-out line and a data/gate line, any malfunctioning of such a contact point causes loss of electrical connection between the lead-out line and the corresponding data/gate line, resulting in malfunctioning of the sub-pixels. Further, the lead-out lines have high impedance which causes a delay in transmission of signals to sub-pixels. The delay leads to unevenness of image displayed on the display device, thereby deteriorating the overall user experience.

According to example implementation of present subject matter, techniques of effective and continuous signal transmission in LCD panels are described. Examples of the techniques described herein allow lead-out lines of an LCD panel to provide continuous transmittance of signals to data/gate lines.

In an example implementation of present subject matter, a display device may include one or more LCD panels. An LCD panel may include a plurality of sub-pixels arranged in a row and a column direction in a matrix arrangement. For the ease of reference, the column direction has been referred to as first direction, and the row direction has been referred to as second direction, hereinafter. The LCD panel may further include multiple gate lines and data lines, extending orthogonal to each other. For example, the data lines may extend in the first direction while the gate lines may extend in the second direction, and vice-versa. For the ease of reference, it has been described that the LCD panel includes multiple first lines extending in the first direction, and multiple second lines extending in the second direction. It would be noted that each of the first lines may be either the data lines or the gate lines, and the second lines may be the other of either the gate lines or the data lines, respectively.

Further, the LCD panel may also include multiple lead-out lines, extending in the first direction, such that the multiple lead-out lines are substantially parallel to the first lines, and orthogonal to the second lines. Since the lead-out lines extend in the first direction, the lead-out lines overlap the second lines extending in the second direction, in plan view. A region where a lead-out line overlaps a second line in plan view, is referred to an overlap region, hereinafter. It would be noted that the LCD panel may include multiple overlap regions where the lead-out lines overlap the second lines, in plan view.

In an example, the lead-out lines may be electrically connected to the second lines in the overlap region, through multiple contact points, such that an electrical connection is established between the lead-out lines and the second lines. For example, a first lead-out line from the multiple lead-out lines may be electrically connected with a given second line from the multiple second lines through two or more contact points within an overlap region.

In another example implementation of the present subject matter, portion of each of the second lines, in the overlap region, may be extended in the first direction, to be electrically connected to a lead-out line through multiple contact points. The extended portion of the second line may allow formation of multiple contact points in the overlap region. In an example, the multiple contact points within the overlap region may be aligned in the first direction. In yet another example implementation of the present subject matter, portion of each of the lead-out lines, in the overlap region, may be extended in the second direction, to be electrically connected to a second line, through multiple contact points. In an example, the multiple contact points may be aligned in the second direction, in the overlap region.

Thus, each of the lead-out lines is electrically connected with at least one second line through two or more contact points, formed in an overlap region. Two or more contact points in the overlap region ensures that the electrical connectivity between the lead-out lines and the second lines is steady and failure of one contact point does not render the sub-pixels useless.

In an example implementation of present subject matter, a conductive patch may be electrically connected to a lead-out line between two adjacent overlap regions from the multiple overlap regions. The conductive patch may be connected via multiple through holes formed in an insulating layer between the lead-out line and the conductive patch. In an example implementation of the present subject matter, the conductive patch may extend in the first direction. Further, each through hole from the plurality of through holes may overlap a distal end of the conductive patch in plan view.

It would be noted that since there are conductive patches arranged between plurality of adjacent overlap regions, the overall impedance of the lead-out lines extending in the first direction may be reduced, which in turn, reduces the delay in signal transmittance within the LCD panel, thus improving overall user experience.

The above-described display devices and LCD panels are further described with reference to FIG. 1 to FIG. 10. It should be noted that the description and figures merely illustrate the principles of the present subject matter along with examples described herein and, should not be construed as a limitation to the present subject matter. It is thus noted that various arrangements may be devised that, although not explicitly described or shown herein, describe the principles of the present subject matter. Moreover, all statements herein reciting principles, aspects, and examples of the present subject matter, as well as specific examples thereof, are intended to encompass equivalents thereof.

As used herein, the singular forms "a", "an" and "the" are intended to include the plural forms as well, unless the context clearly indicates otherwise. The terms "first" and "second" are for differentiating one element from the other element, and these elements should not be limited by these terms. Although the terms "first", "second", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present subject matter.

It should be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. It will be also understood that when an element or layer is referred to as being "on", "connected to" or "coupled to" another element or layer, it can be directly on, connected or coupled to the other element or layer or intervening elements or layers may be present. Like numbers refer to like elements throughout. As used herein, the term "and/or" includes any and all combinations of one or more of the associated listed items.

Also, spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the elements.

[First Implementation]

FIG. 1 schematically illustrates the configuration plan of an LCD panel 100 of a display device, in accordance with this example implementation of present subject matter. The LCD panel 100 includes multiple pixels 102-1, 102-2, 102-3, . . . , 102-$n$, arranged in first direction and a second direction to form a matrix, to display an image. The pixels 102-1, 102-2, 102-3, . . . , 102-$n$ have been commonly referred to as pixels 102, hereinafter. Further, each pixel, such as the pixel 102-1 may contain subpixels 102-1-A, 102-1-B, and 102-1-C. The LCD panel 100 may further include multiple data lines 104-1, 104-2, 104-3, . . . , 104-$n$ extending in first direction, and parallel to each other, and multiple gate lines, 106-1, 106-2, 106-3, . . . 106-$n$, extending in the second direction, and parallel to each other. The LCD panel 100 may further include multiple gate lead-out lines 108-1, 108-2, . . . , 108-$n$ extending in first direction, and parallel to data lines 104-1, 104-2, 104-3, . . . , 104-$n$. In an example, the multiple gate lead-out lines 108-1, 108-2, . . . , 108-$n$ may also be substantially parallel to each other. For the ease of reference, the multiple data lines 104-1, 104-2, 104-3, . . . , 104-$n$ have been commonly referred to as data lines 104, the multiple gate lines, 106-1, 106-2, 106-3, . . . , 106-$n$ have been commonly referred to as gate lines 106, and the multiple gate lead-out lines 108-1, 108-2, . . . , 108-$n$ have been commonly referred to as the gate lead-out lines 108.

In an example, the data lines 104 may be formed in a same layer as the gate lead-out lines 108. For example, a data line 104-1 out of the data lines 104, is formed in the same layer as a gate lead-out line 108-1 out of the gate lead-out lines 108.

The LCD panel 100 may also include a data driver (not shown) to drive the data lines 104, and a gate driver (not shown) to drive the gate lead-out lines 108 where the data lines 104 and gate-lead out lines 108 extend in the first direction. In an example, the gate driver and the data driver both may be placed on the first side of the LCD panel 100. In another example, the gate driver and the data driver may be placed on different side of the first side or second side opposite to the first side of the LCD panel 100. Therefore, this configuration does not require a space for placing the gate drivers and the data drivers in a third or fourth side which is perpendicular with the first and second side. And it can lead to low bezels. A gate lead-out line from the gate lead-out lines 108 extending in first direction overlaps a gate line from the gate lines 106 extending in second direction to form overlap regions. For example, the gate lead-out line 108-1 may overlap the gate line 106-1 to form the overlap regions 110-1-1 110-1-2, 110-1-3, . . . , 110-1-$n$. Similarly, each of the gate lead-out lines 108 may overlap with gate lines 106 to form overlap regions 110-2-1, 110-2-2, . . . , 110-2-$n$; . . . ; 110-$n$-1, 110-$n$-2, . . . , 110-$n$-$n$. For the ease of reference, the overlap regions 110-1-1, 110-1-2, . . . , 110-1-$n$; 110-2-1, 110-2-2, . . . , 110-2-$n$; . . . ; 110-$n$-1, 110-$n$-2, . . . , 110-$n$-$n$, may be collectively referred to as overlap regions 110, hereinafter.

In this example implementation of present subject matter, in the overlap region, a gate line from the gate lines 106, may have an extended area in the first direction to be electrically connected to a gate lead-out line from the gate lead-out lines 108. For example, in the overlap region 110-1-1, the gate line 106-1 may have an extended area in the first direction to be electrically connected to the gate lead-out line 108-1.

Further, each of the gate lines 106, may be electrically connected to a gate lead-out line from the gate lead-out lines 108 through multiple contact points, in an overlap region. For example, a gate lead-out line 108-1 from the gate lead-out lines 108 may be electrically connected to a gate line 106-1 through two or more contact points 112-1, 112-2, . . . , 112-5, hereinafter referred to as contact points 112, in the overlap region 110-1-1. Similarly, the contact points 112 may be formed in other overlap regions 110, to form an electrical connection between the gate lead-out lines 108 and the gate lines 106. Each gate lien 106 has number of overlap region 110 and has at least one overlap region 110 where the contact points 112 are formed and has at least one overlap region where the contact point 112 is not formed. For example, the gate line 106-1 has a plurality of overlap regions 110 including an overlap region 110-1-1 and an overlap region 110-2-1. A contact point 112 is formed in the overlap region 110-1-1 and no contact point 112 is formed in the overlap region 110-2-1. Similarly each gate lead-out line 108 has number of overlap region 110 and has at least one overlap region 110 where the contact points 112 are formed and has at least one overlap region where the contact point 112 is not formed. For example, The gate lead-out line 108-1 has a plurality of overlap regions 110 including an overlap region 110-1-1 and an overlap region 110-1-2. A contact point 112 is formed in the overlap region 110-1-1 and no contact point 112 is formed in the overlap region 110-1-2.

In an example, the contact points 112 may be formed by forming a through hole (not shown) in the overlap region 110 where the gate lead-out lines 108 and the gate lines 106 overlap in plan view. For instance, the contact point 112-1 is formed by forming a through hole in the overlap region 110-1-1, formed by the overlap of the gate lead-out line 108-1 and the gate line 106-1. Further, the through hole may electrically connect the gate lead-out line 108 and the gate line 106. The electrical connection between the through hole and the gate lead-out line 108 and the gate line 106 may allow a signal transmitted by the gate driver (not shown) to be transmitted to the gate line 106 via the gate lead-out line 108. For example, the contact points 112 may allow a signal transmitted by the gate driver to be transmitted to the gate line 106-1, via the gate lead-out line 108-1.

Further, each sub-pixel, such as the sub-pixel 102-1-A is arranged in a section between intersection of two adjacent data lines, such as data lines 104-1 and 104-2, and two adjacent gate lines, such as gate lines 106-1 and 106-2.

Figure 2:
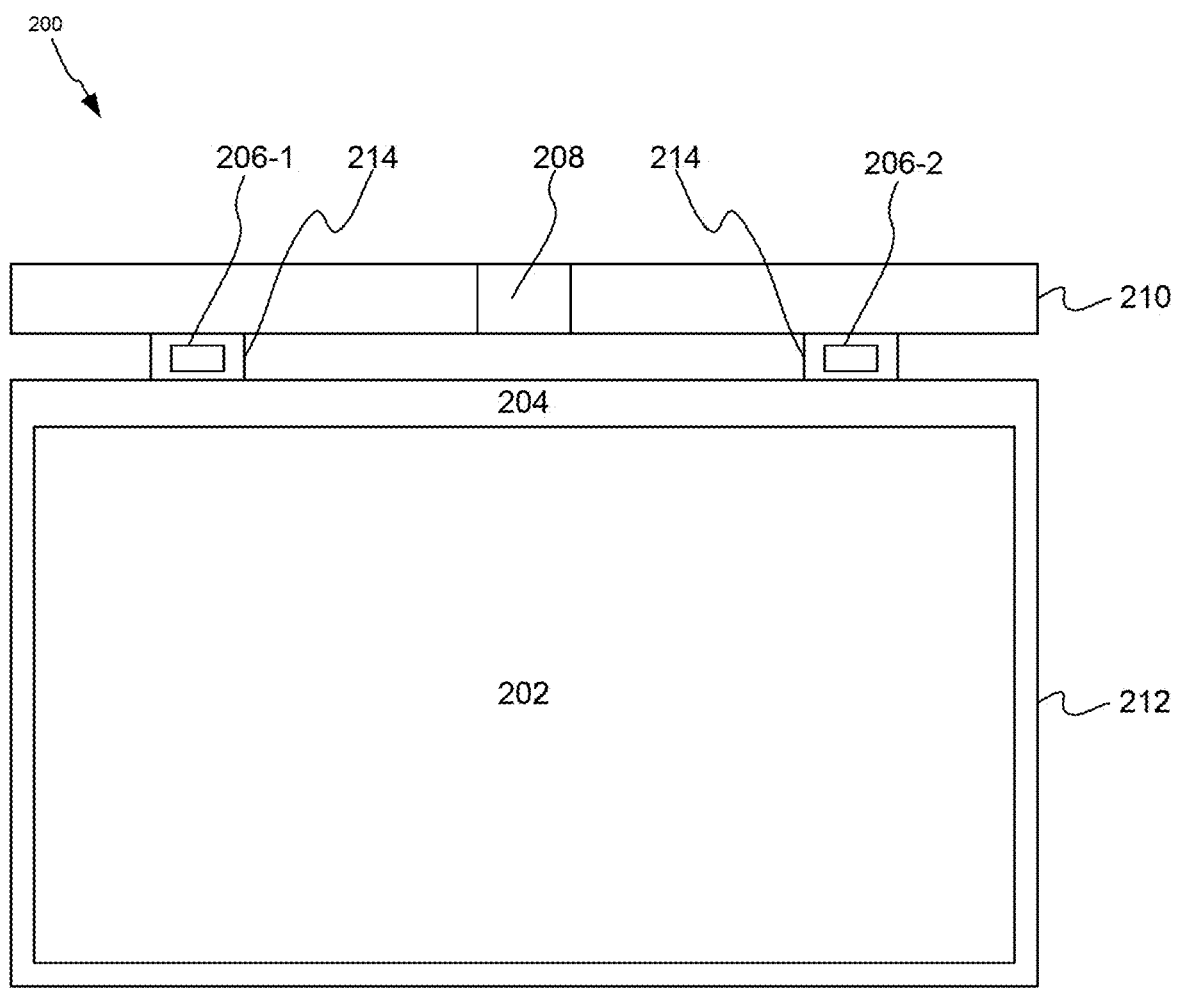
FIG. 2 illustrates a schematic representation of a display device, according to the first implementation of present subject matter.

FIG. 2 illustrates a schematic representation of an LCD panel 212 of a display device 200, in accordance with an example implementation of the present subject matter. The LCD panel 212 includes a display portion 202 and a non-display portion 204. It would be noted that the display portion 202 may display an image while the non-display portion 204 may include a bezel that may surround the display portion 202. In an example, the display portion 202 may include data lines (not shown), gate lines (not shown), and gate lead-out lines (not shown) extending parallel to data lines.

In another example, the display portion 202 may include multiple pixels (not shown) which may be driven by data lines, gate lines, and data lead-out lines (not shown) extending parallel to gate lines. The LCD panel 200 may further include one or more drivers to drive the pixels (not shown). The one or more drivers may either be mounted on the non-display portion 204 as Chip-on-glass (COG) implementation or may be implemented on films 214 connecting the non-display portion 204 with a printed circuit board (PCB) 210, as Chip-on-film (COF).

In an example, the one or more drivers may include a data driver 206-1 to drive the data lines, and a gate driver 206-2 to drive the gate lines via the gate lead-out lines. Furthermore, the LCD panel 212 may include at least one timing controller 208, mounted on the PCB 210, to time and control the drive of the data driver 206-1 and the gate driver 206-2.

Figure 3:
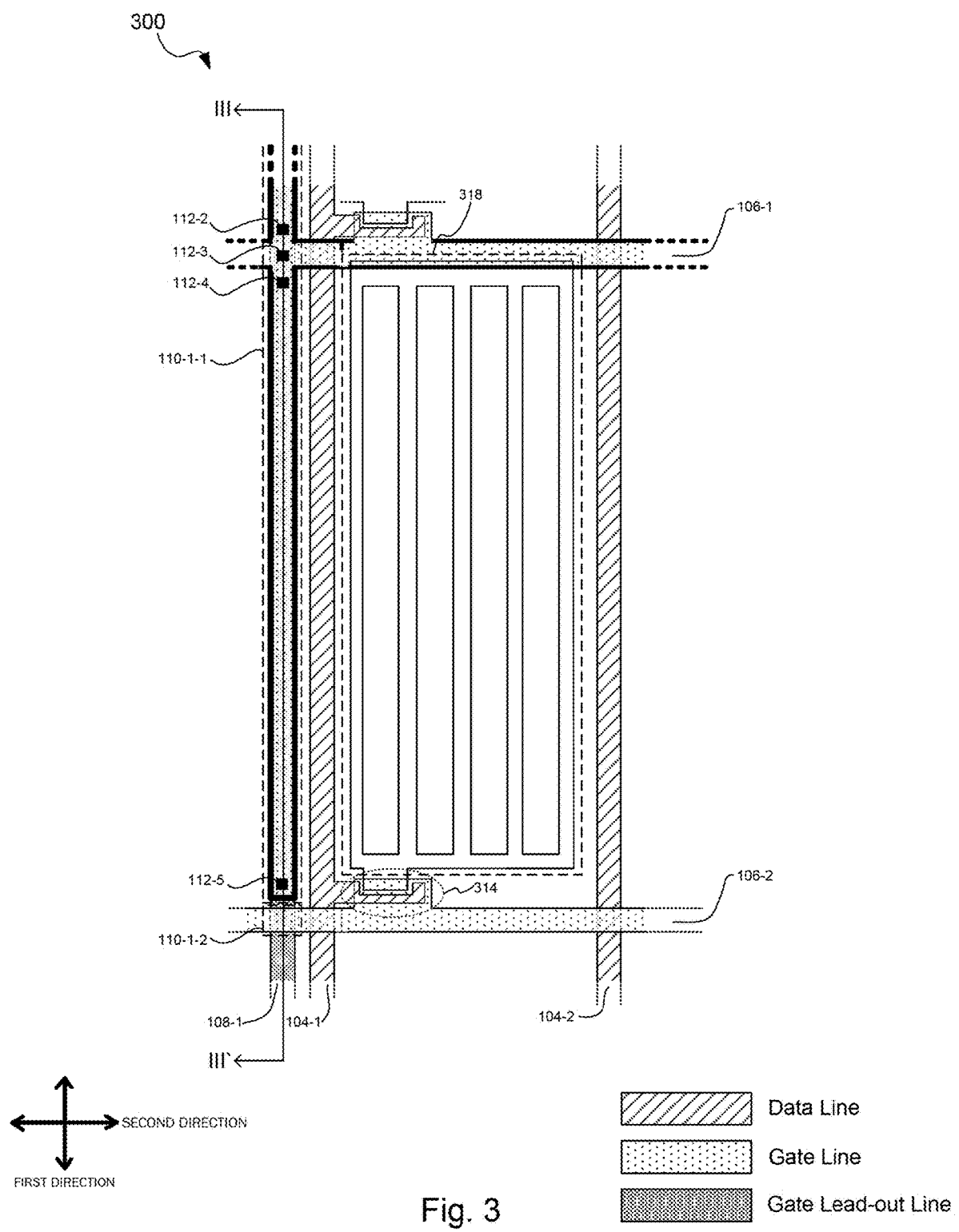
FIG. 3 illustrates a plan view of a sub-pixel, according to the first implementation of the present subject matter.

FIG. 3 represents a schematic representation of a sub-pixel 300, in plan view. The sub-pixel 300 is included within the intersection of two adjacent data lines 104 and two adjacent gate lines 106. For example, the sub-pixel 300 may be included within the intersection of two adjacent data lines 104-1 and 104-2, and two adjacent gate lines 106-1 and 106-2. Further, a gate lead-out line, such as gate lead-out line 108-1, parallel to data lines 104-1 and 104-2, may also formed along with at least one of the two data lines 104-1 and 104-2. The sub-pixel 300 may be a part of any of the pixels 102 of the LCD panel 100. In an example of the present subject matter, the sub-pixel 300 is bounded by two gate lines 106-1 and 106-2, and two data lines 104-1 and 104-2. In the example, a gate lead-out line 108-1 is also formed along with the data line 104-1.

In operation, the sub-pixel 300, may also include various other elements and or layers, such as a colour filter (CF) layer (not shown) and a liquid crystal (LC) layer (not shown), however, such elements and layers have not been shown and explained for the sake of brevity.

Further, the sub-pixel 300 may include a thin film transistor (TFT) 314, a common electrode (not shown), and insulating layer (not shown) formed on the common electrode, and sub-pixel electrode 318 formed on the insulating layer. In an example of the present subject matter, the common electrode is made of a transparent material, such as indium-tin oxide, or indium-zinc oxide. Further, in an example of the present subject matter, the sub-pixel electrode 318 is made of a transparent material, for example, indium-tin oxide or indium-zinc oxide.

In an example of present subject matter, the sub-pixel 300 further includes an overlap region 110-1-1 formed on the intersection of a gate lead-out line 108-1, extending in the first direction, and a gate line 106-1, extending in second direction. The gate line 106-1 is electrically connected to the gate lead-out line 108-1 through multiple contact points, formed in the overlap region 110-1-1. The gate lead-out line 108-1 may further overlap a gate line 106-2 to form another overlap region 110-1-2. It would be noted that the contact points are formed in the overlap regions 110, where the gate lines 106-1 has an extended portion extending in the first direction in the overlap region. For instance, the contact points are formed in the overlap region 110-1-1. Contrarily, any contact point does not formed in the overlap region 110-1-2 where the gate line 106-2 does not has an extended portion.

In an example implementation of the present subject matter, the gate line 106-1 has the extended portion extending in the first direction in the overlap region 110-1-1 to be electrically connected to the gate lead-out line 108-1 through the multiple contact points. In an example of the present subject matter, the extended portion of the gate line 106-1 may allow formation of multiple contact points 112-1 (not shown), 112-2, 112-3, 112-4, and 112-5, hereinafter referred to as contact points 112. The presence of the multiple contact points 112 in the overlap region 110-1-1 ensures that the electrical connectivity of the gate lead-out line 108-1 and gate line 106-1 is steady and failure of one contact point does not render the sub-pixels useless.

In one example, the gate lead-out line 108-1, and the data line 104-1 may be formed in a same layer, made of metal, such as copper (Cu) or aluminium (Al), during fabrication. That is, during the fabrication of the sub-pixel 300, while the data lines 104-1 is formed in a layer, the gate lead-out line 108-1 may also be formed in the same layer, such that the data line 104-1 and the gate lead-out line 108-1 are parallel to each other, in the same layer. It would be noted that while data line 104-1 and the gate lead-out line 108-1 are formed in a same layer and are parallel to each other, the data line 104-1 and the gate lead-out line 108-1 may be electrically insulated from each other by an insulating material, such as Silicon Nitride (SiN) or Silicon Dioxide ($SiO_2$).

In another example, the gate lead-out line 108-1 and the data line 104-1 may be formed in different layers, during fabrication. That is, during the fabrication of the sub-pixel 300, while the data line 104-1 is formed in one layer, the gate lead-out line 108-1 may be formed in another layer, where the data line 104-1 and the gate lead-out line 108-1 are substantially parallel to each other.

Figure 4:
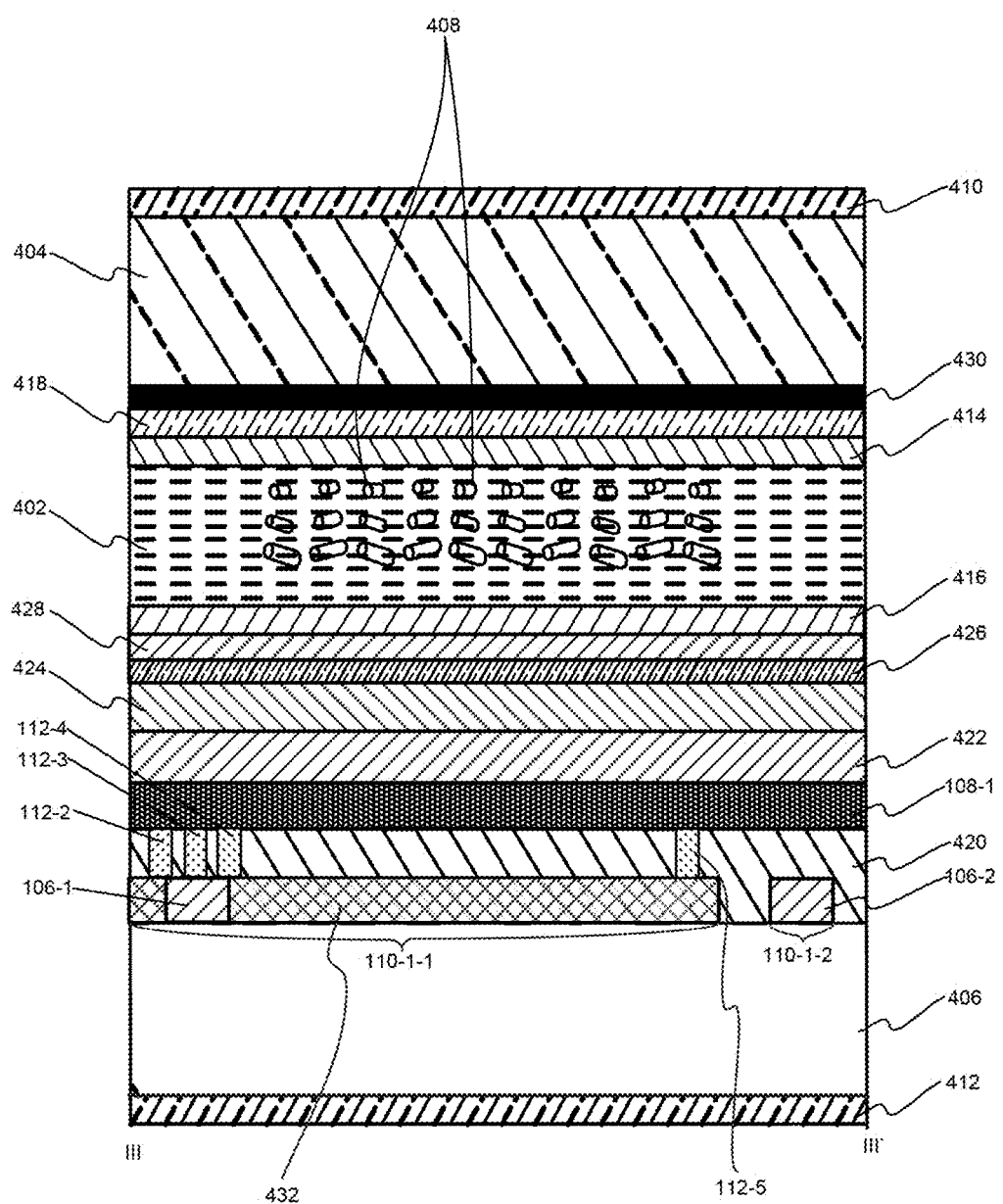
FIG. 4 illustrates a cross-sectional view of a sub-pixel taken along a line III-III', according to the first implementation of present subject matter.

FIG. 4 illustrates a cross sectional view of a sub-pixel along line III-III' of FIG. 3, according to an example implementation of the present subject matter.

FIG. 4 shows a liquid crystal (LC) layer 402 between an upper substrate 404 and a lower substrate 406. The upper substrate 404 and the lower substrate 406 are made of a transparent material, such as glass or transparent plastic. The LC layer 402 includes liquid crystal molecules 408. A first polarizer 410 is disposed on an outer surface of the upper substrate 404, and a second polarizer 412 is disposed on an outer surface of the lower substrate 406, as shown in FIG. 4. The first polarizer 410 and the second polarizer 412 are disposed such that their polarization axes are perpendicular to each other.

Further, a first alignment layer 414 and a second alignment layer 416 sandwich the LC layer 402. The first alignment layer 414 and the second alignment layer 416 are for fixing the alignment of the liquid crystal molecules 408 in the LC layer 402. The first alignment layer 414 and second alignment layer 416 may be made of a polyamide.

Further, a colour filter (not shown) is formed on the upper substrate 404. The colour filter includes pigments of red, green, or blue colour, depending on the coloured light emitted by the sub-pixel 300. An overcoat layer 418 is coated on the colour filter. The overcoat layer 418 prevents pigments from releasing out to the LC layer 402.

Further, a gate insulating layer 420 is formed on an inner surface of the lower substrate 406. The gate insulating layer 420 covers the gate lines 106-1 and 106-2 shown in FIG. 4. The gate insulating layer 420 may be formed of silicon nitride (SiN), silicon dioxide ($SiO_2$), or alumina. As shown in FIG. 4, the gate lead-out line 108-1 is formed above the gate insulating layer 420. The gate lead-out line 108-1 is formed on the same layer as that of a data line (not shown). Further, the gate line 106-1 and the gate lead-out line 108-1 overlap each other in an extended overlap region 110-1-1 in plan view. The gate line 106-1 has extended portion 432 to from the extended overlap region 110-1-1. The extended overlap region 110-1-1 allows formation of two or more contact points 112-1 (not shown), 112-2, 112-3, . . . , 112-5, hereinafter referred to as contact points 112, between the gate line 106-1 and the gate lead-out line 108-1. A protective insulating layer 422 is formed to cover the gate lead-out line 108-1. The protective insulating layer 422 may be formed of silicon nitride (SiN) or silicon dioxide (SiO2). Further, an organic protective insulating layer 424 is formed on the protective insulating layer 422. The organic protective insulating layer 424 is a photosensitive resist and is made of an acrylic material.

Further, as shown in FIG. 4, a common electrode 426 is formed on the organic protective insulating layer 424. The common electrode 426 is made of a transparent material, such as indium-tin oxide, indium-zinc oxide. An upper portion insulating layer 428 is formed on the common electrode 426. The upper portion insulating layer 428 is made of silicon nitride (SiN) or silicon dioxide ($SiO_2$).

Further, a black matrix 430 is formed on an inner side of the upper substrate 404. The black matrix 430 prevents mixing of colours displayed by sub-pixels adjacent to the sub-pixel 300.

According to the first implementation, the gate line 106 has an extended portion extending in the same direction as the gate lead-out lines 104 extend. The gate line 106 and the gate lead-out lines 104 are electrically connected each other in the overlapping region 110 through two or more contact points 112. Two or more contact points in the overlap region ensures that the electrical connectivity between the gate lead-out lines and the gate lines is steady and failure of one contact point does not render the sub-pixels useless.

[Second Implementation]

Figure 5:
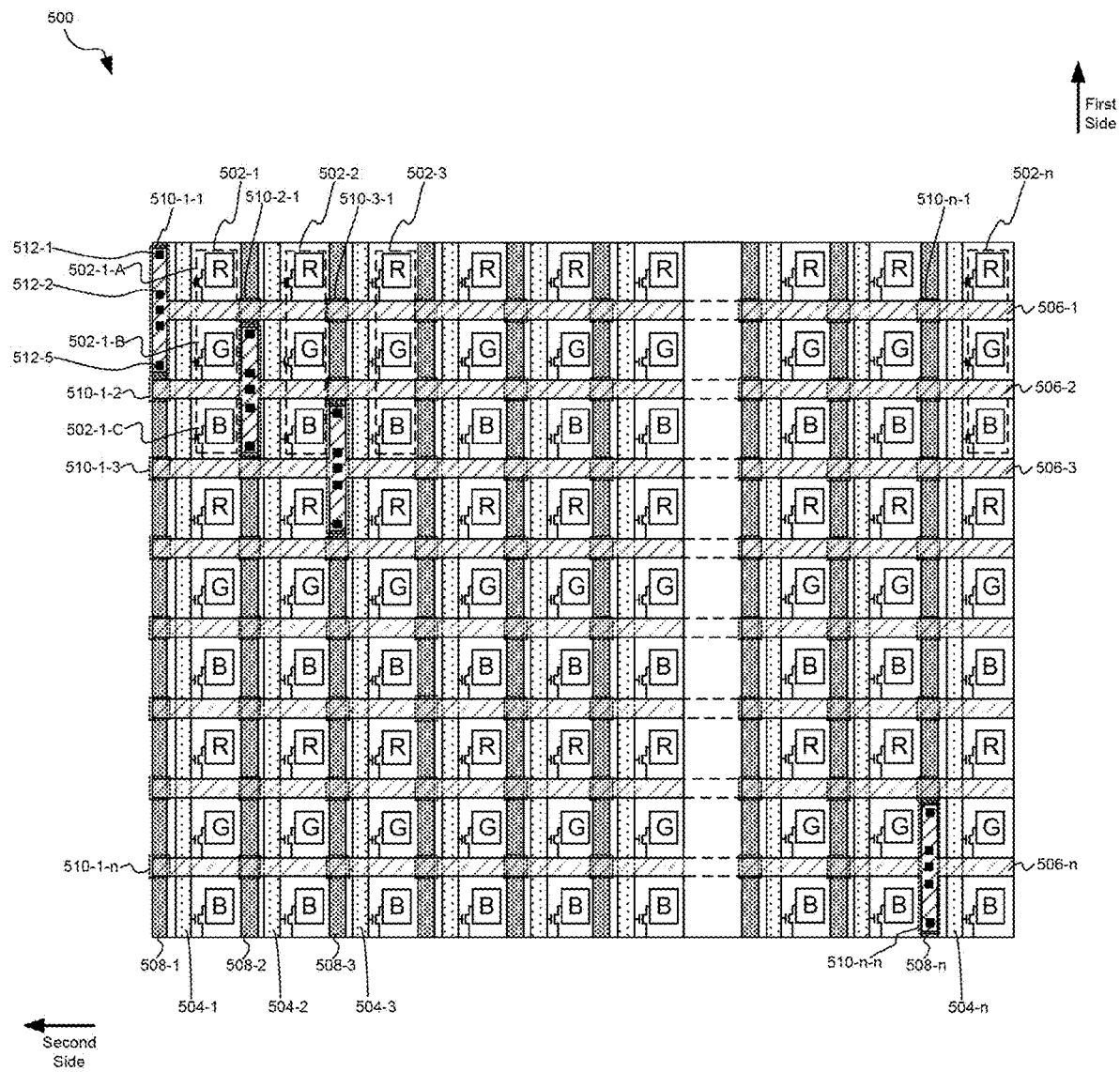
FIG. 5 illustrates a schematic configuration in a display area of a display device including data lead-out lines, according to a second implementation of present subject matter.

FIG. 5 schematically illustrates a schematic configuration plan in a display area of an LCD panel 500 of a display device, in accordance with a second implementation of present subject matter. In an example, the LCD panel 500 may be obtained by rotating the LCD panel 100 by 90 degrees in clockwise direction. The LCD panel 500 has multiple pixels, arranged in a first direction and a second direction to form a matrix, to display an image. The pixels 502-1, 502-2, 502-3, . . . , 502-*n* have been commonly referred to as pixels 502, hereinafter. Further, each pixel 502 may contain subpixels. For example, pixel 502-1 may contain sub-pixels 502-1-A, 502-1-B, and 502-1-C. The LCD panel may further include multiple gate lines 504-1, 504-2, 504-3, . . . , 504-*n* extending in first direction, and parallel to each other, and multiple data lines 506-1, 506-2, 506-3, . . . , 506-*n* extending in second direction, and parallel to each other. The LCD panel may further include multiple data lead-out lines 508-1, 508-2, . . . , 508-*n* extending in first direction, and parallel to gate lines 504-1, 504-2, 504-3, . . . , 504-*n*. In an example, the data lead-out lines 508-1, 508-2, 508-3, . . . , 508-*n* may be substantially parallel to each other. For the ease of reference, the multiple gate lines 504-1, 504-2, 504-3, . . . , 504-*n* have been commonly referred to as gate lines 504, the multiple data lines, 506-1, 506-2, 506-3, . . . 506-*n* have been commonly referred to as data lines 506, and the multiple data lead-out lines 508-1, 508-2, . . . , 508-*n* have been commonly referred to as the data lead-out lines 508.

In an example, the gate lines 504 may be formed in a same layer as data lead-out lines 508. For example, a gate line 504-1 out of the gate lines 504, is formed in the same layer as a data lead-out line 508-1 out of the data lead-out lines 508.

The display device may also include a gate driver (not shown) to drive gate lines 504, and a data driver (not shown) to drive data lines 506 via data lead-out lines 508, where the gate lines 504 and data lead-out lines 508 may extend in the first direction. In an example, the gate driver and the data driver both may be placed on the first side of the LCD panel 500. In another example, the gate driver may be placed on the first side of the LCD panel 500, and the data driver may be placed on the second side opposite to the first side of LCD panel 500. A data lead-out line from the data lead-out lines 508 extending in the first direction, overlaps a data line from the data lines 506 extending in the second direction to form an overlap region. For example, a data lead-out line 508-1 may overlap with a data line 506-1 to form an overlap region 510-1-1. The data lead-out line 508-1 may further overlap data lines 506 to form the overlap regions 510-1-2, 510-1-3, . . . , 510-1-*n*. Similarly, the data lead-out lines 508 extending in the first direction, may overlap the data lines 506 extending in the second direction, to form multiple overlap regions 510-2-1, 510-2-2 (not shown), . . . , 510-2-*n*, . . . , 510-1-*n*, 510-2-*n* (not shown), . . . , 510-*n*-*n*. For the ease of reference, the overlap regions 510-1-1, 510-1-2, . . . , 510-1-*n*; 510-2-1, 510-2-2, . . . , 510-2-*n*; . . . ; 510-*n*-1, 510-*n*-2, . . . , 510-*n*-*n*, may be collectively referred to as overlap regions 110, hereinafter.

In an example implementation of present subject matter, in the overlap region, a data line from the data lines 506, may extend in the first direction to be electrically connected to a data lead-out line from the data lead-out lines 508. For example, in the overlap region 510-1-1, the data line 506-1 may extend in the first direction to be electrically connected to the data lead-out line 508-1.

Further, each of the data lead-out lines 508 may be electrically connected to a data line out of the data lines 506 through multiple contact points. For example, the data lead-out line 508-1 may be electrically connected to data line 506-1 through two or more contact points 512-1, 512-2, . . . , 512-5, hereinafter referred to as contact points 512, in the overlap region 510-1-1. Similarly, the contact points may be formed in other overlap regions 510, to form an electrical connection between the data lead-out lines 508 and the data lines 506.

In an example, the contact points 512 may be formed by forming a through hole (not shown) in the overlap region formed by the overlap of the data lead-out lines 508 and the data lines 506. For instance, the contact point 512-1 is formed by forming a through hole in the overlap region 510-1-1 formed by the overlap of the data lead-out line 508-1 and the data line 506-1. Further, the through hole may be electrically connected to the data lead-out line 508-1 and the data line 506. The electrical connection between the data lead-out line 508 or the data line 506 via the through holes may allow a signal transmitted by the data driver (not shown) to be transmitted to the data line 506 via the data lead-out line 508. For example, the contact points 512 allow a signal transmitted by the data driver to be transmitted to the data line 506-1 via the data lead-out line 508-1.

Further, each sub-pixel, such as the sub-pixel 502-1-A is arranged in a section between intersection of two adjacent gate lines, such as the gate lines 504-1 and 504-2, and two adjacent data lines, such as data lines 506-1 and 506-2.

Figure 6:
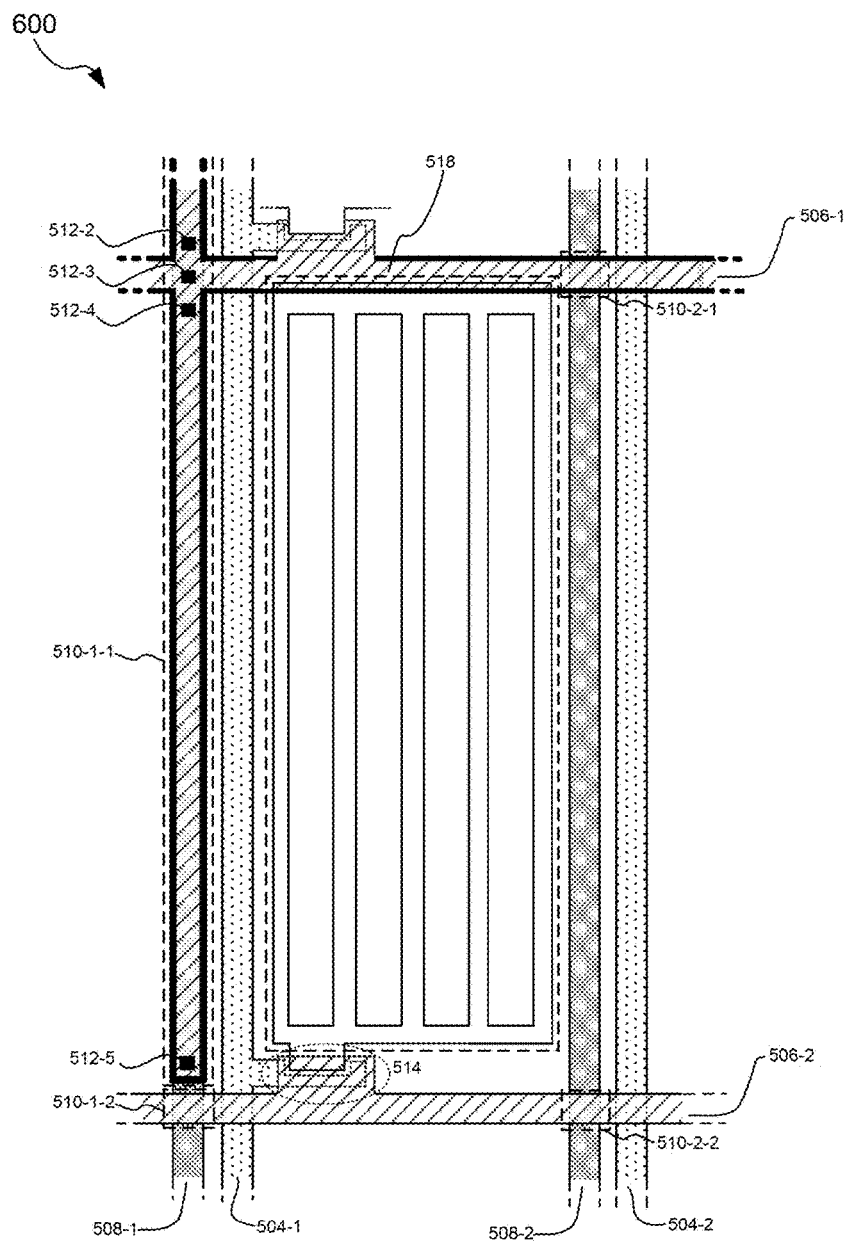
FIG. 6 illustrates a plan view of a sub-pixel including data lead-out lines, according to the second implementation of the present subject matter.

FIG. 6 represents a schematic representation of a sub-pixel 600, in plan view. The sub-pixel 600 is included within the intersection of two adjacent gate lines 504 and two adjacent data lines 506, such as within the intersection of two adjacent gate lines 504-1 and 504-2, and two adjacent data lines 506-1 and 506-2. Further, data lead-out lines, such as data lead-out lines 508-1 and 508-2, parallel to gate lines 504-1 and 504-2, may also formed, along with gate lines 504-1 and 504-2. The sub-pixel 600 may be a part of any of the pixels 502 of the LCD panel 500. In an example of the present subject matter, the sub-pixel 600 is bounded by two gate lines 504-1 and 504-2, and two data lines 506-1 and 506-2. In the example, the data lead-out line 508-1 is formed along with gate line 504-1.

In operation, the sub-pixel 600, may also include various other elements and or layers, such as a colour filter (CF) layer (not shown) and a liquid crystal (LC) layer (not shown), however, such elements and layers have not been shown and explained for the sake of brevity.

Further, the sub-pixel 600 may include a thin film transistor (TFT) 514, a common electrode (not shown), and insulating layer (not shown) formed on the common electrode, and sub-pixel electrode 518 formed on the insulating layer. In an example of the present subject matter, the common electrode is made of a transparent material, such as indium-tin oxide, indium-zinc oxide. Further, in an example of the present subject matter, the sub-pixel electrode 518 is made of a transparent material, for example, indium-tin oxide.

In an example of the present subject matter, the sub-pixel 600 also includes an overlap region 510-1-1 formed on the intersection of a data lead-out line 508-1 extending in the first direction, and a data line 506-1 extending in second direction. The data lead-out line 508-1 is electrically connected to the data line 506-1 through multiple contact points in the overlap region 510-1-1. The data lead-out line 508-1 may further overlap a data line 506-2 to form an overlap-region 510-1-2. It would be noted that the contact points are formed in the overlap regions 510, where the data lines 506 extend in the first direction in the overlap region. For instance, the contact points are formed in the overlap region 510-1-1 out of the overlap regions 510-1-1 and 510-1-2. Similarly, the data lead-out line 508-2 may overlap the data lines 506-1 and 506-2 to form overlap regions 510-2-1 and 510-2-2 respectively.

In another example implementation of the present subject matter, in the overlap region 510-1-1, the data line 506-1 further extends in the first direction to be electrically connected to the data lead-out line 508-1 through the multiple contact points. In an example, the extended portion of the data line 506-1 may allow formation of multiple contact points 512 in the overlap region 510-1-1.

In one example, the data lead-out lines 508-1 and 508-2, and the gate lines 504-1 and 504-2 may be formed in a same layer, during fabrication. That is, during the fabrication of the sub-pixel 600, while the gate lines 504-1 and 504-2 are formed in a layer, the data lead-out lines 508-1 and 508-2 may also be formed in the same layer, such that the gate lines 504-1 and 504-2 and the data lead-out line 508-1 are parallel to each other. It would be noted that while the gate lines 504-1 and 504-2 and the data lead-out lines 508-1 and 508-2 are formed in a same layer and are parallel to each other, the gate lines 504-1 and 504-2 and the data lead-out lines 508-1 and 508-2 may be electrically insulated from each other by an insulating material, such as Silicon Nitride (SiN) or Silicon Dioxide ($SiO_2$).

In another example, the data lead-out lines 508-1 and 508-2 and the gate lines 504-1 and 504-2 may be formed in different layers, during fabrication. That is, during the fabrication of the sub-pixel 600, while the gate lines 504-1 and 504-2 are formed in one layer, the data lead-out lines 508-1 and 508-2 may be formed in another layer, where the gate lines 504-1 and 504-2 and the data lead-out lines 508-1 and 508-2 are substantially parallel to each other.

According to the second implementation, the data line 506 has an extended portion extending in the same direction as the data lead-out lines 508 extend. The data line 506 and the data lead-out lines 508 are electrically connected each other in the overlapping region 510 through two or more contact points 512. Two or more contact points in the overlap region ensures that the electrical connectivity between the data lead-out lines and the data lines is steady and failure of one contact point does not render the sub-pixels useless.

[Third Implementation]

Figure 7:
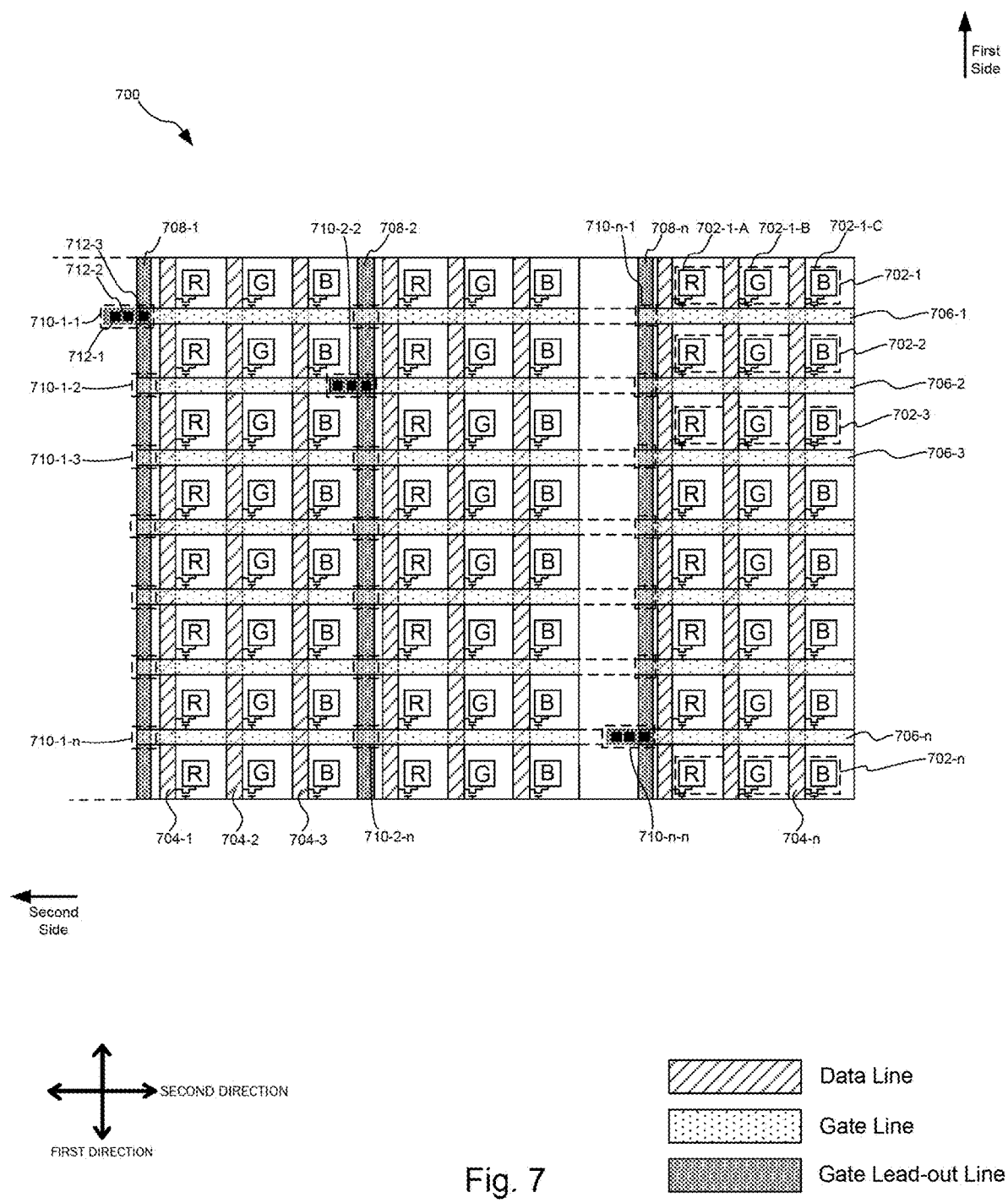
FIG. 7 illustrates a schematic configuration in a display area of a display device including extended gate lead-out lines, according to a third example implementation of present subject matter.

FIG. 7 illustrates schematically illustrates a schematic configuration plan in a display area of an LCD panel 700 of a display device, in accordance with a third implementation of present subject matter. The LCD panel has multiple pixels, arranged in a first direction and a second direction to form a matrix. The pixels 702-1, 702-2, 702-3, . . . , 702-*n* has been commonly referred to as pixels 702, hereinafter. Further, each pixel 702 may contain subpixels. For example, pixel 702-1 may contain subpixels 702-1-A, 702-1-B, and 702-1-C. The LCD panel may further include multiple data lines 704-1, 704-2, 704-3, . . . , 704-*n* extending in the first direction, and parallel to each other, and multiple gate lines 706-1, 706-2, 706-3, . . . , 706-*n* extending in second direction, and parallel to each other. The LCD panel may further include multiple gate lead-out lines 708-1, 708-2, . . . , 708-*n* extending in first direction, and parallel to data lines 704-1, 704-2, 704-3, . . . , 704-*n*. In an example, the gate lead-out lines 708-1, 708-2, . . . , 708-*n* may be substantially parallel to each other. For the ease of reference, the multiple data lines 704-1, 704-2, 704-3, . . . , 704-*n* have been commonly referred to as data lines 704, the multiple gate lines, 706-1, 706-2, 706-3, . . . , 706-*n* have been commonly referred to as gate lines 706, and the multiple gate lead-out lines 708-1, 708-2, . . . , 708-*n* have been commonly referred to as the gate lead-out lines 708.

In an example, the data lines 704 may be formed in a same layer as gate lead-out lines 708. For example, a data line 704-1 out of the data lines 704, is formed in the same layer as a gate lead-out line 708-1 out of the gate lead-out lines 708.

The display device may also include a data driver (not shown) to drive data lines 704, and a gate driver (not shown) to drive gate lead-out lines 708, where the data lines 704 and gate lead-out lines 708 may extend in the first direction. A lead-out line from the gate lead-out lines 708 extending in the first direction, overlaps a gate line from the gate lines 706 extending in the second direction to form an overlap region. For example, a gate lead-out line 708-1 may overlap with a gate line 706-1 to form an overlap region 710-1-1. The gate lead-out line 708-1 may further overlap gate lines 706 to form the overlap regions 710-1-2, 710-1-3, . . . , 710-1-*n*. Similarly, the gate lead-out lines 708 extending in the first direction, may overlap the gate lines 706 extending in the first direction, to form multiple overlap regions 710-2-1, 710-2-2, . . . , 710-2-*n*; . . . , 710-1-*n*, 710-2-*n*, . . . , 710-*n*-*n*. For the ease of reference, the overlap regions 710-1-1, 710-1-2, . . . , 710-1-*n*; 710-2-1, 710-2-2, . . . , 710-2-*n*; . . . ; 710-*n*-1, 710-*n*-2, 710-*n*-*n*, may be collectively referred to as overlap regions 710, hereinafter.

Further, each of the gate lead-out lines 708 may be electrically connected to a gate line out of the gate lines 706 through multiple contact points. For example, the gate lead-out line 708-1 from gate lead-out lines 708, may be electrically connected to the gate line 706-1 from gate lines 706, through two or more contact points 712-1, 712-2, 712-3, hereinafter referred to as 712, in the overlap region 710-1-1. Similarly, the contact points 712 may be formed in other overlap regions 710, to form an electrical connection between the gate lead-out lines 708 and gate lines 706.

In an example implementation of present subject matter, in the overlap region 710-1-1, a gate lead-out line 708-1 from gate lead-out lines 708, may extend in second direction to be electrically connected to a gate line 706-1 through multiple contact points. In an example, the extended portion of the gate lead-out line 708-1 may allow formation of multiple contact points 712-1, 712-2 and 712-3 in the overlap region 710-1-1. In the example, an extended portion of the gate lead-out line 708-1 may be wider in the second direction than a middle portion of the gate lead-out line 708-1, between two adjacent overlap region 710, such that, the gate lead-out line 708-1 may form a cross shape in the overlap region 710-1-1. Further, the extended portion of the gate lead-out lines 708, may extend in a side opposite to the nearest data lines 704. For instance, the extended portion of gate lead-out line 708-1 extends in the opposite direction to the nearest data line 704-1. Because the gate lead-out line 704-1 and a source and a drain electrode of a thin film transistor (TFT) are formed in the same layer, the extended portion of gate lead-out line 708-1 is designed in order to avoid a contact between the extended portion and the source and drain electrode of TFT.

In an example, the contact points 712 may be formed by forming a through hole (not shown) in the overlap region formed by the overlap of the gate lead-out lines 708 and the gate lines 706. For instance, the contact point 712-1 is formed by forming a through hole in the overlap region 710-1-1 formed by the overlap of the gate lead-out line 708-1 and the gate line 706-1. Further, the through hole may be electrically connected to the gate lead-out line 708 and the gate line 706. The electrical connection between the gate lead-out line 708 and the gate line 706 via the through hole may allow a signal transmitted by the gate driver (not shown) to be transmitted to the gate line 706 via the gate lead-out line 708. For example, the contact points 712 allow a signal transmitted by the gate driver to be transmitted to the gate line 706-1 via the gate lead-out line 708-1.

According to the third implementation, the gate lead-out line 708 has an extended portion extending in the same direction as the gate lines 706 extend. The gate lead-out line 708 and the gate lines 706 are electrically connected each other in the overlapping region 710 through two or more contact points 712. Two or more contact points in the overlap region ensures that the electrical connectivity between the gate lead-out lines and the gate lines is steady and failure of one contact point does not render the subpixels useless.

[Fourth Implementation]

Figure 8:
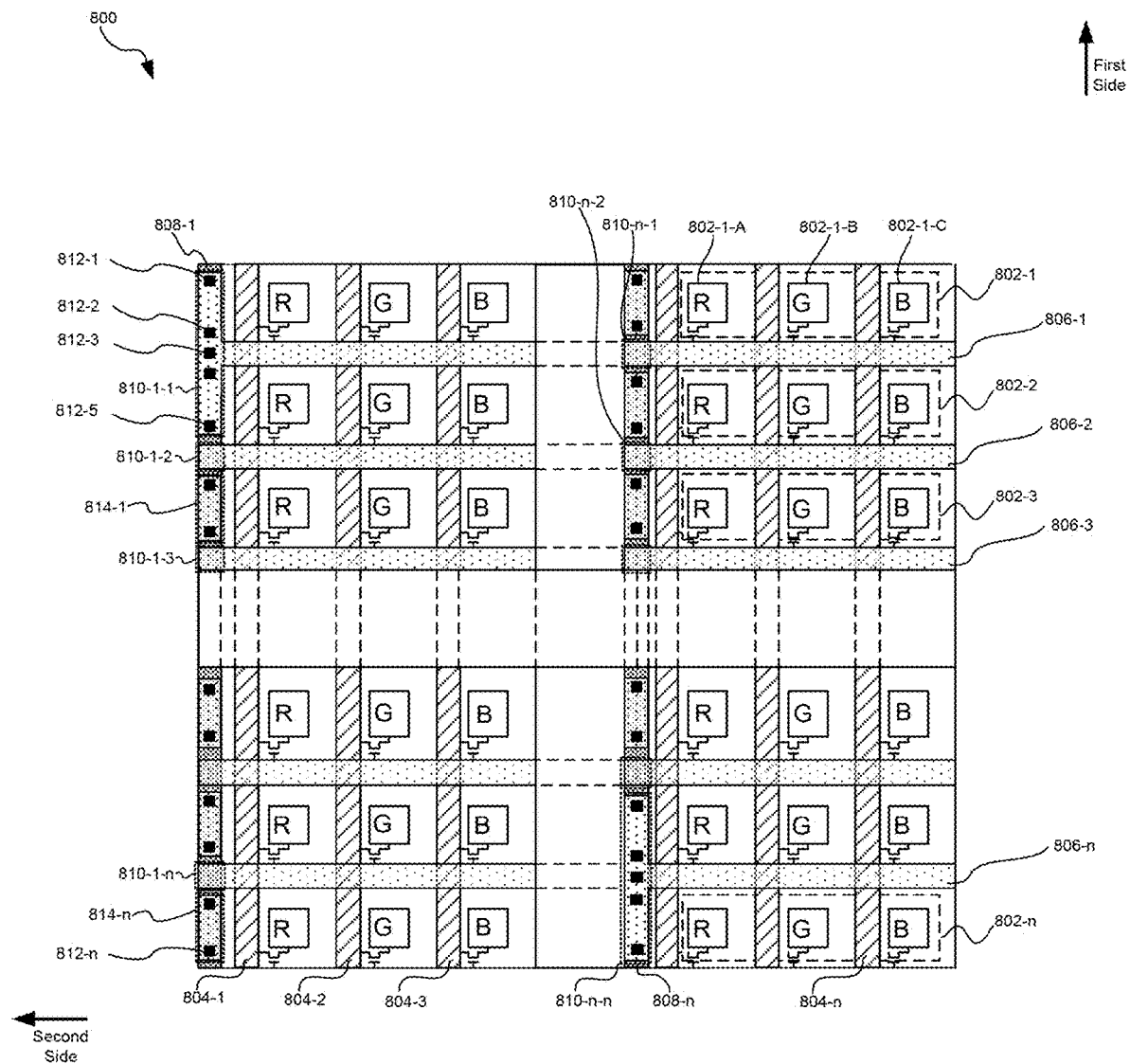
FIG. 8 illustrates a schematic configuration in a display area of a display device including conductive patches, according to a fourth implementation of present subject matter.

FIG. 8 schematically illustrates a schematic configuration plan in a display area of an LCD panel 800 of a display device, in accordance with a fourth implementation of present subject matter. The LCD panel 800 includes multiple pixels 802-1, 802-2, 802-3, . . . , 802-*n*, arranged in a first direction and a second direction to form a matrix. The pixels 802-1, 802-2, 802-3, . . . , 802-*n* have been commonly referred to as pixels 802, hereinafter. Further, each pixel 802 may contain subpixels, such as, the pixel 802-1 may contain subpixels 802-1-A, 802-1-B, and 802-1-C. The LCD panel may further include multiple data lines 804-1, 804-2, 804-3, . . . , 804-*n* extending in first direction, and parallel to each other, and multiple gate lines 806-1, 806-2, 806-3, . . . , 806-*n* extending in second direction, and parallel to each other. The LCD panel may further include multiple gate lead-out lines 808-1, . . . , 808-*n* extending in first direction, and parallel to data lines 804-1, 804-2, 804-3, . . . , 804-*n*. In an example, the gate lead-out lines 808-1, 808-2, . . . , 808-*n* may be substantially parallel to each other. For the ease of reference, the multiple data lines 804-1, 804-2, 804-3, . . . , 804-*n* have been commonly referred to as data lines 804, the multiple gate lines, 806-1, 806-2, 806-3, . . . , 806-*n* have been commonly referred to as gate lines 806, and the multiple gate lead-out lines 808-1, 808-2, . . . , 808-*n*, have been commonly referred to as the gate lead-out lines 808.

The display device may also include a first driver (not shown) to drive data lines 804, and a second driver (not shown) to drive gate lead-out lines 808, where the data lines 804 and gate lead-out lines 808 may extend in the first direction. In an example, the first driver may be placed on the first side of the LCD panel 800, and the second driver may be placed on the second side of the LCD panel 800. In another example, the first driver and the second driver may be placed either on the first side or second side of the LCD panel 800. A gate lead-out line from the gate lead-out lines 808 extending in the first direction, overlaps a gate line from the gate lines 806 extending in the second direction to form an overlap region. For example, a gate lead-out line 808-1 may overlap with a gate line 806-1 to form an overlap region 810-1-1-1. The gate lead-out line 808-1 may further overlap gate lines 806 to form the overlap regions 810-1-2, 810-1-3, . . . , 810-1-*n*. Similarly, each gate lead-out line from the gate lead-out lines 808 may overlap with gate lines 806 to form overlap regions 810-2-1, 810-2-2, . . . , 810-2-*n* (not shown); . . . ; 810-*n*-1, 810-*n*-2, . . . , 810-*n*-*n*. For the ease of reference, the overlap regions 810-1-1, 810-1-2, . . . , 810-1-*n*; 810-2-1, 810-2-2, . . . , 810-2-*n*; . . . ; 810-*n*-1, 810-*n*-2, . . . , 810-*n*-*n*, may be collectively referred to as overlap regions 810, hereinafter. In an example implementation of present subject matter, in the overlap region, a gate line from the gate lines 806, may extend in the first direction to be electrically connected to a gate lead-out line from the gate lead-out lines 808. For example, in the overlap region 810-1-1, the gate line 806-1 may extend in the first direction to be electrically connected to the gate lead-out line 808-1.

Further, each of the gate lead-out lines 808 may be electrically connected to a gate line out of the gate lines 806 through multiple contact points. For example, the gate lead-out line 808-1 may be electrically connected to gate line 806-1 through two or more contact points 812-1, 812-2, . . . , 812-5, hereinafter referred to as 812, in the overlap region 810-1-1. Similarly, the contact points may be formed in other overlap regions 810, to form an electrical connection between the gate lead-out lines 808 and the gate lines 806.

In an example implementation of present subject matter, the LCD panel 800 may further include conductive patches 814-1, 814-2 (not shown), . . . , 814-*n*, hereinafter referred to as conductive patches 814, electrically connected to the gate lead-out lines 808. In an example, the conductive patches may be made of metal, including but not limited to, copper (Cu) and aluminium (Al).

The conductive patch 814-1 out of the conductive patches 814 may overlap a gate lead-out line 808-1 out of the gate lead-out lines 808, in plan view. In an example, an insulating layer (not shown) may be present between the conductive patch 814-1 and the gate lead-out line 808-1. To electrically connect the conductive patch 814-1 to the gate lead-out line 808-1, multiple through holes, such as, 812-*k* and 812-*m*, may be formed in the insulating layer between the conductive patch 814-1 and gate lead-out line 808-1. The through holes 812-*k* and 812-*m* may pass through the insulating layer to connect the conductive patch 814-1 and the gate lead-out line 808-1. Further, a conductive patch out of the conductive patches 814 may be connected between two adjacent overlap regions out of multiple overlap regions 810. For example, a conductive patch 814-1 may be formed between overlap regions 810-1-1 and 810-1-3.

Although implementation for the LCD panel 800 has been described specifically with respect to gate lead-out lines, it is to be understood that a similar implementation for the LCD panel 800 is possible with respect to data lead-out lines.

Figure 9:
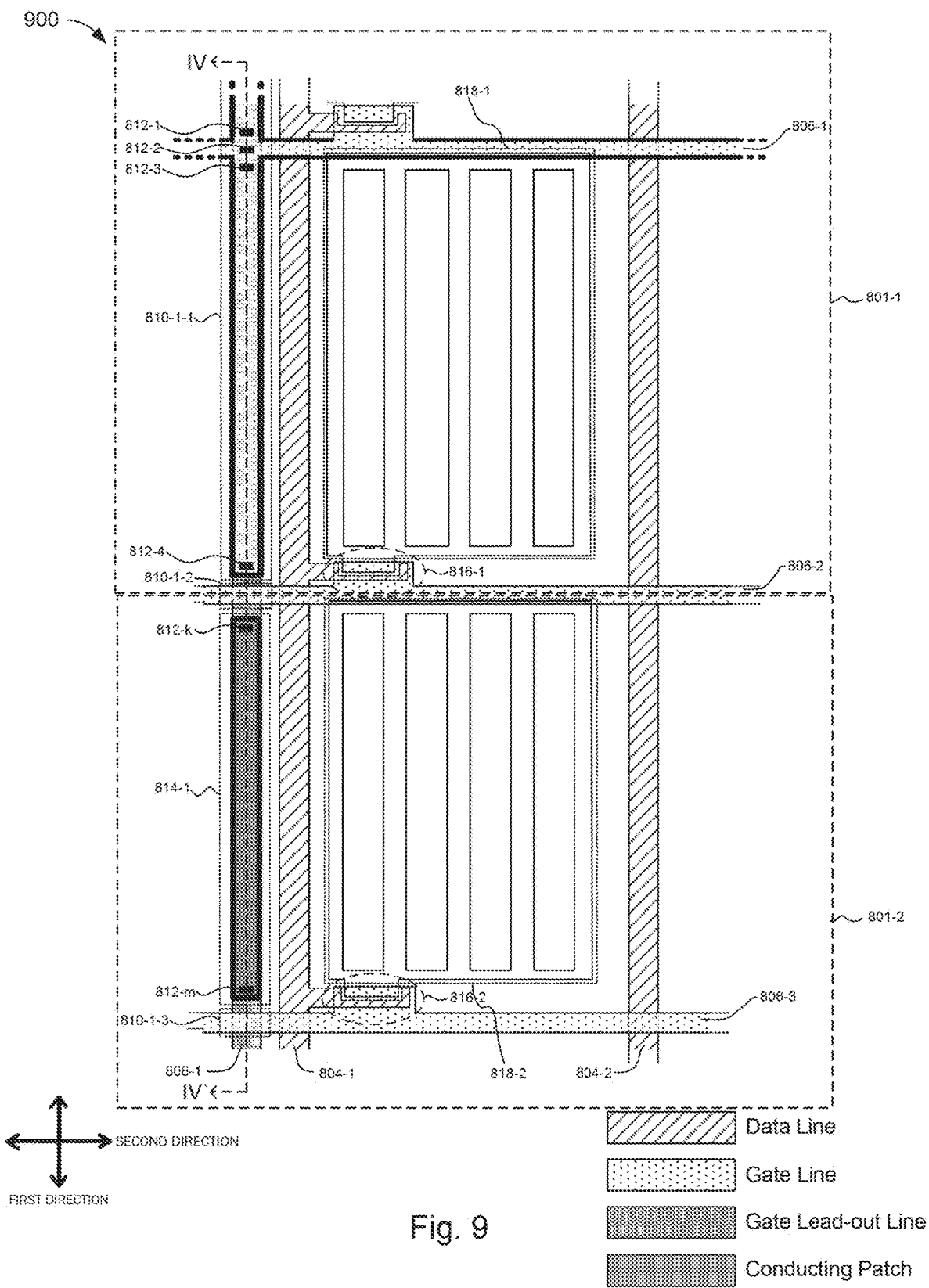
FIG. 9 illustrates a plan view of a sub-pixel pair, according to the fourth implementation of present subject matter.

FIG. 9 represents a schematic representation of a sub-pixel pair 900, joined end-to-end in the first direction, in plan view. The sub-pixel pair 900 may include a first sub-pixel 801-1 and a second sub-pixel 801-2 in FIG. 8 joined end-to-end in the first direction. Each sub-pixel out of the sub-pixel pair 900 is included within the intersection of two adjacent data lines 804 and two adjacent gate lines 806. For example, a first sub-pixel 801-1 out of the sub-pixel pair 900 may be arranged within the intersection of two adjacent data lines 804-1 and 804-2, and two adjacent gate lines 806-1 and 806-2. Similarly, a second sub-pixel 801-2 out of the sub-pixel pair 900 may be arranged within the intersection of two adjacent data lines 804-1 and 804-2, and two adjacent gate lines 806-2 and 806-3. The sub-pixel pair 900 may further include a gate lead-out line 808-1, parallel to data lines 804-1 and 804-2, along with at least one of the gate lines 804-1 and 804-2.

In operation, the first sub-pixel 801-1 and the second sub-pixel 801-2 of the sub-pixel pair 900, may also include various other elements and or layers, such as a colour filter (CF) layer (not shown) and a liquid crystal (LC) layer (not shown), however, such elements and layers have not been shown and explained for the sake of brevity.

Further, the each of the first sub-pixel 801-1 and the second sub-pixel 801-2 out of the sub-pixel pair 900 may include thin-film transistors (TFT) 816-1 and 816-2, common electrodes (not shown), and insulating layers (not shown) formed on the common electrodes, and sub-pixel electrodes 818-1 and 818-2 formed on the insulating layers of the respective first sub-pixel 801-1 and second sub-pixel 801-2. In an example of the present subject matter, the common electrode is made of a transparent material, such as indium-tin oxide, indium-zinc oxide. Further, in an example of the present subject matter, each of the sub-pixel electrodes 818-1 and 818-2 are made of a transparent material, for example, indium-tin oxide.

In an example of the present subject matter, the first sub-pixel 801-1 out of the sub-pixel pair 900, includes an overlap region 810-1-1 formed on the intersection of a gate lead-out line 808-1 extending in the first direction, and a gate line 806-1 extending in second direction. The gate line 806-1 is electrically connected to the gate lead-out line 808-1 through multiple contact points in the overlap region 810-1-1.

In an example implementation of the present subject matter, in the overlap region 810-1-1, the gate line 806-1 has an extended portion extending in the first direction to be electrically connected to the lead-out line 808-1 through the multiple contact points 812-1, 812-2, 812-3, and 812-4. In an example, the extended portion of the gate line 806-1 may allow formation of multiple contact points 812.

In another example of the present subject matter, the second sub-pixel 801-2 out of the sub-pixel pair 900 includes overlap regions 810-1-1, 810-1-2, . . . , 810-1-*n* formed on the intersection of a gate lead-out line 808-1 extending in the first direction, and gate lines 806-1 and 806-2 extending in second direction. The second sub-pixel 801-2 further includes a conductive patch 814-1 formed between the adjacent overlap regions 810-1-1 and 810-1-2. The conductive patch 814-1 may be connected to the gate lead-out line 808-1 through multiple through holes, such as 812-*k* and 812-*m*, formed in an insulating layer between the gate lead-out line 808-1 and the conductive patch 814-1. In an example implementation of present subject matter, the through holes 812-*k* and 812-*m* may be located at distal ends of the conductive patch 814-1.

Figure 10:
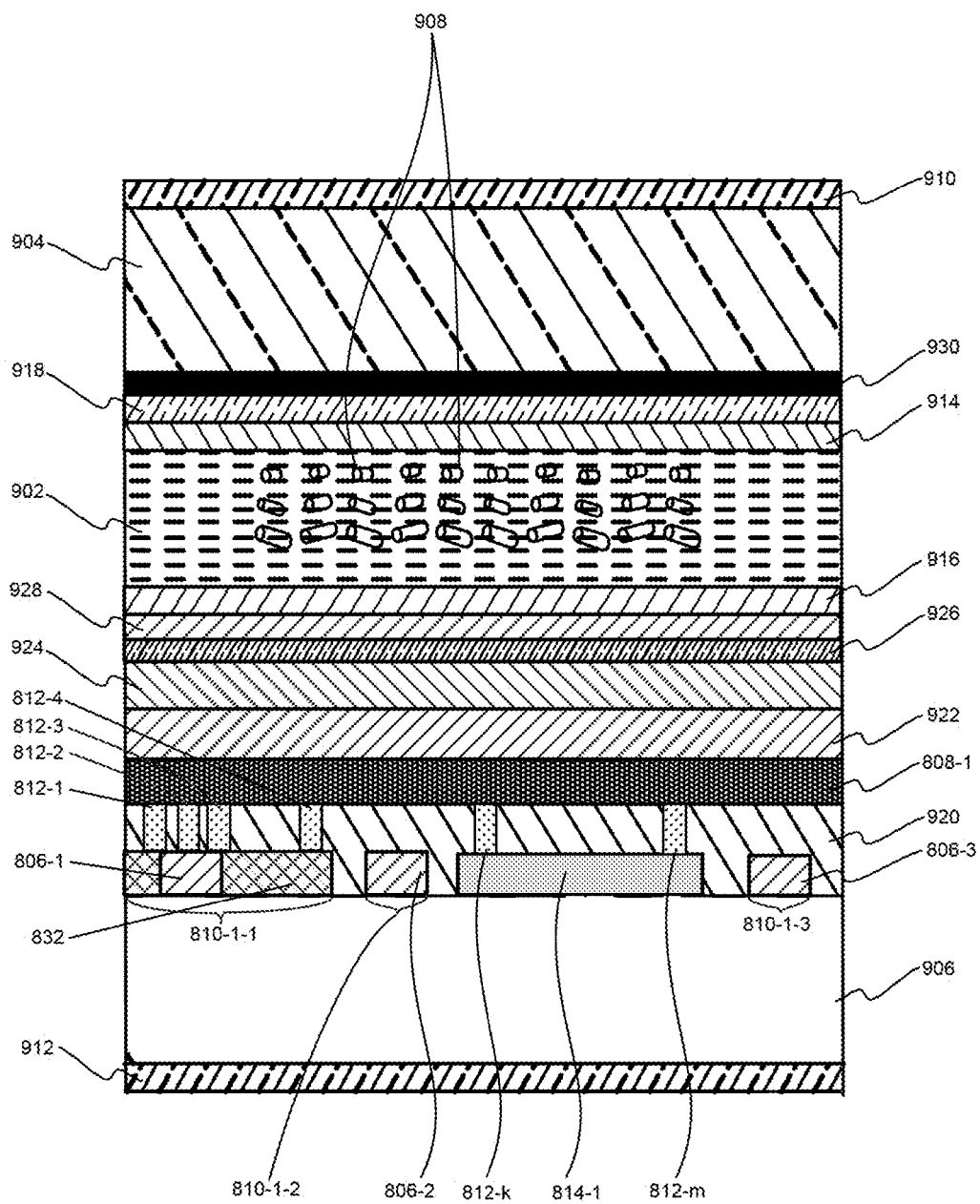
FIG. 10 illustrates a cross-sectional view of a sub-pixel taken along a line IV-IV' in FIG. 9, according to the fourth implementation of present subject matter.

FIG. 10 illustrates a cross sectional view of a sub-pixel pair 900 along line IV-IV' of FIG. 9, according to an example implementation of the present subject matter.

FIG. 10 shows a LC layer 902 between an upper substrate 904 and a lower substrate 906. The upper substrate 904 and the lower substrate 906 are made of a transparent material, such as glass or transparent plastic. The LC layer 902 includes liquid crystal molecules 908. A first polarizer 910 is disposed on an outer surface of the upper substrate 904, and a second polarizer 912 is disposed on an outer surface of the lower substrate 906, as shown in FIG. 10. The first polarizer 910 and the second polarizer 912 are disposed such that their polarization axes are perpendicular to each other.

Further, a first alignment layer 914 and a second alignment layer 916 sandwich the LC layer 902. The first alignment layer 914 and the second alignment layer 916 are for fixing the alignment of the liquid crystal molecules 908 in the LC layer 902. The first alignment layer 914 and second alignment layer 916 may be made of a polyamide.

Further, a colour filter (not shown) is formed on the upper substrate 904. The colour filter includes pigments of red, green, or blue colour, depending on the coloured light emitted by the sub-pixel pair 900. An overcoat layer 918 is coated on the colour filter. The overcoat layer 918 prevents pigments from releasing out to the LC layer 902.

Further, a gate insulating layer 920 is formed on an inner surface of the lower substrate 906. The gate insulating layer 920 covers the gate lines 806-1, 806-2, and 806-3; and the conducting patch 814-1. The gate insulating layer 920 may be formed of silicon nitride (SiN), silicon dioxide (SiO2), or alumina. As shown in FIG. 10, the gate lead-out line 808-1 is formed on the gate insulating layer 920. The gate lead-out line 808-1 is formed on the same layer as that of a data line (not shown). The gate lead-out line 808-1 overlaps multiple gate lines 806-1, 806-2, 806-3 to form overlap region 810-1-1, 810-1-2, 810-1-3. The gate lead-out line 808-1 and the gate line 806-1 overlap each other and are electrically connected to each other through multiple contact points. Furthermore, the gate line 806-1 has an extended portion 832 to from an extended overlap region 810-1-1. The extended overlap region 810-1-1 allows formation of two or more contact points 812-1 (not shown), 812-2, 812-3, and 812-4, hereinafter referred to as contact points 812, between the gate line 806-1 and gate lead-out line 808-1. Further, the conducting patch 814-1 is also formed in the same layer as that of gate lines 806-1, 806-2, and 806-3. The conducting patch 814-1 is connected to the gate lead-out line 808-1 via multiple through holes 812-k and 812-m. The through holes 812-k and 812-m passes through the gate insulating layer 920 to electrically connect the conducting patch 814-1 and the gate lead-out line 808-1. A protective insulating layer 922 is further formed to cover the gate lead-out line. The protective insulating layer 922 may be formed of silicon nitride (SiN) or silicon dioxide (SiO2). Further, an organic protective insulating layer 924 is formed on the protective insulating layer 922. The organic protective insulating layer 924 is a photosensitive resist and is made of an acrylic material.

Further, as shown in FIG. 10, a common electrode 926 is formed on the organic protective insulating layer 924. The common electrode 926 is made of a transparent material, such as indium-tin oxide, indium-zinc oxide. An upper portion insulating layer 928 is formed on the common electrode 926. The upper portion insulating layer 928 is made of silicon nitride (SiN) or silicon dioxide (SiO2).

Further, a black matrix 930 is formed on an inner side of the upper substrate 904. The black matrix 930 prevents mixing of colours displayed by sub-pixels adjacent to the sub-pixel pair 900.

According to the fourth implementation, the conductive patch 814 may extend in the same direction as the gate lead-out line extends. The conductive patch is arranged between two adjacent overlap regions. The overall impedance of the gate lead-out lines may be reduced, which in turn, reduces the delay in signal transmittance within the LCD panel, thus improving overall user experience.

Although implementations for display devices have been described in a language specific to structural features, it is to be understood that the appended claims are not necessarily limited to the specific features described. Rather, the specific features are disclosed as example implementations for the display devices.

What is claimed is:

1. A display device comprising:
a plurality of sub-pixels arranged in a first direction and a second direction in a matrix arrangement;
a plurality of first lines extending in the first direction;
a plurality of second lines extending in the second direction;
a plurality of lead-out lines extending in the first direction; and
a plurality of overlap regions, an overlap region from the plurality of overlap regions where a lead-out line from the plurality of lead-out lines and a second line from the plurality of second lines overlap in plan view, wherein
the lead-out line electrically connects to the second line through two or more contact holes formed in the overlap region, the two or more contact holes being formed in an insulating layer between the lead-out line and the second line and being aligned in the first direction,
the second line has an extended portion extending in the first direction and overlapping the lead out line in the overlap region,
at least one of the two or more contact holes overlaps the extended portion, and
the second line is a gate line and the extended portion extends towards both opposite sides of the display device.

2. The display device as claimed in claim 1, wherein the lead-out line is a gate lead-out line.

3. The display device as claimed in claim 2, further comprises a gate driver placed at a first side of the display device, wherein
the gate driver electrically connects to the gate line via the gate lead-out line.

4. The display device as claimed in claim 1, wherein the second line has an extended portion formed in the overlap region, the extended portion being wider in the first direction than a middle portion of the second line formed between two adjacent overlap regions.

5. The display device as claimed in claim 4, wherein the second line is a gate line and the extended portion extends towards both opposite sides of the display device.

6. The display device as claimed in claim 1, wherein the second line has a cross shape formed in the overlap region.

7. The display device as claimed in claim 1, wherein the lead-out line electrically connects to a conductive patch formed between two adjacent overlap regions from the plurality of overlap regions via a plurality of through holes formed in an insulating layer between the lead-out line and the conductive patch, wherein the conductive patch extends in the first direction.

8. The display device as claimed in claim 7, wherein each through hole from the plurality of through holes is located overlapping a distal end of the conductive patch in plan view.

9. The display device as claimed in claim 1, wherein the first line from the plurality of first lines is a data line, and wherein the lead out line is formed in a same layer of the data line.

10. The display device as claimed in claim 1, wherein the extended portion is wider in the first direction than a middle portion of the second line formed between two adjacent overlap regions.

* * * * *